(12) United States Patent
You et al.

(10) Patent No.: US 11,181,775 B2
(45) Date of Patent: Nov. 23, 2021

(54) ILLUMINATION DEVICE AND ELECTRONIC APPARATUS INCLUDING THE SAME

(71) Applicant: SAMSUNG ELECTRONICS CO., LTD., Suwon-si (KR)

(72) Inventors: Jangwoo You, Seoul (KR); Seunghoon Han, Seoul (KR); Namseop Kwon, Suwon-si (KR); Byunghoon Na, Suwon-si (KR); Minkyung Lee, Suwon-si (KR); Suyeon Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 218 days.

(21) Appl. No.: 16/460,434

(22) Filed: Jul. 2, 2019

(65) Prior Publication Data

US 2020/0081294 A1     Mar. 12, 2020

Related U.S. Application Data

(60) Provisional application No. 62/729,696, filed on Sep. 11, 2018.

(30) Foreign Application Priority Data

Jan. 23, 2019     (KR) .......................... 10-2019-0008607

(51) Int. Cl.
    *G02F 1/13357*          (2006.01)

(52) U.S. Cl.
    CPC .... *G02F 1/133606* (2013.01); *G02F 2202/30* (2013.01); *G02F 2202/36* (2013.01)

(58) Field of Classification Search
    CPC ........... G02F 1/133606; G02F 2202/30; G02F 2202/36; G06K 9/2027; G06K 9/4661;
(Continued)

(56) References Cited

U.S. PATENT DOCUMENTS 9,951,935 B2    4/2018   Cotte
2014/0168651 A1*   6/2014   Guo ..................... G02B 5/1809
                                                                             356/445
(Continued)

FOREIGN PATENT DOCUMENTS

CN           107229088 A     10/2017
KR    10-2017-0134212 A     12/2017

OTHER PUBLICATIONS

Amir Arbabi et al., "An optical metasurface planar camera", ARXIV. org, Cornell University Library, 201, Olin Library Cornell University, XP080696914, Ithaca, NY, Apr. 21, 2016, pp. 1-29.
(Continued)

*Primary Examiner* — Joseph L Williams
*Assistant Examiner* — Jose M Diaz
(74) *Attorney, Agent, or Firm* — Sughrue Mion, PLLC

(57) ABSTRACT

Provided in an illumination device including a display panel including a first surface configured to display an image, a second surface opposite to the first surface, a plurality of display pixels disposed between the first surface and the second surface, and a transmission window configured to transmit light incident on the second surface through the first surface, a light source disposed at the second surface of the display panel and configured to emit light to an object toward the display panel, and a light deliverer disposed between the light source and the display panel, the light deliverer configured to deliver the light emitted from the light source to the object as flood illumination through the transmission window.

20 Claims, 17 Drawing Sheets

(58) Field of Classification Search
CPC ........ G06K 9/22; G02B 5/188; G02B 5/1809; G02B 6/005; G02B 6/0055; G09F 19/12; G09F 9/33; G09F 9/35; B82Y 20/00; H01L 27/326; H01L 27/3234; H01L 27/32; H04M 1/22
See application file for complete search history.

(56) References Cited

U.S. PATENT DOCUMENTS

| | | |
|---|---|---|
| 2016/0069999 A1 | 3/2016 | Lee et al. |
| 2017/0090018 A1 | 3/2017 | Buettgen et al. |
| 2018/0005006 A1 | 1/2018 | Chai et al. |
| 2019/0196267 A1* | 6/2019 | Yoo .................. B29D 11/00326 |
| 2020/0018885 A1* | 1/2020 | Wang .................... G02B 6/0036 |
| 2020/0099836 A1* | 3/2020 | Chao .................. G02B 27/0075 |
| 2020/0209729 A1* | 7/2020 | Chen .................... G03B 21/625 |

OTHER PUBLICATIONS

Communication dated Jan. 27, 2020, issued by the European Patent Office in counterpart European Application No. 19187397.5.

* cited by examiner

ILLUMINATION DEVICE AND ELECTRONIC APPARATUS INCLUDING THE SAME

CROSS-REFERENCE TO RELATED APPLICATIONS

This application is based on and claims the benefit of U.S. Provisional Patent Application No. 62/729,696, filed on Sep. 11, 2018 in the United States Patent and Trademark Office, and claims priority from Korean Patent Application No. 10-2019-0008607, filed on Jan. 23, 2019 in the Korean Intellectual Property Office, the disclosures of which are incorporated herein by reference in their entireties.

BACKGROUND

1. Field

Example embodiments of the present disclosure relate to illumination devices and electronic apparatuses including the same.

2. Description of the Related Art

In mobile and wearable devices, there is a demand for various sensors such as an iris recognition sensor, a facial sensor, a depth sensor, etc., and various light sources and optical parts for this purpose are provided together with the mobile and wearable devices.

In recent years, a display of a smart phone has been developed with a full screen display, and since a display surface covers almost all of the area of a front surface of the device, it is not easy to arrange a light source for such a sensor appropriately.

SUMMARY

One or more example embodiments provide illumination devices that emit light to a front side of a display panel.

Additional aspects will be set forth in part in the description which follows and, in part, will be apparent from the description, or may be learned by practice of example embodiments.

According to an aspect of an example embodiment, there is provided an illumination device including a display panel including a first surface configured to display an image, a second surface opposite to the first surface, a plurality of display pixels disposed between the first surface and the second surface, and a transmission window configured to transmit light incident on the second surface through the first surface, a light source disposed at the second surface of the display panel and configured to emit light to an object toward the display panel, and a light deliverer disposed between the light source and the display panel, the light deliverer configured to deliver the light emitted from the light source to the object as flood illumination through the transmission window.

The light deliverer may include a plurality of nanostructures having a shape dimension smaller than that of a wavelength of the light emitted from the light source.

The transmission window may include a plurality of non-pixel regions, the plurality of display pixels may be configured to reflect the light emitted from the light source, and the plurality of display pixels and the plurality of non-pixel regions may be alternately provided.

A fill factor of a cross-sectional area occupied by the plurality of display pixels on the first surface may be 50% to 60%.

The light deliverer may include a substrate including a third surface facing the display panel and a fourth surface facing the light source, a meta-mirror disposed on the third surface and including a plurality of first nanostructures having a shape dimension smaller than that of a wavelength of the light emitted from the light source, wherein the plurality of first nanostructures have a shape distribution such that the plurality of first nanostructures is configured to operate as a mirror in which an aperture is formed in a center portion, and a meta-lens disposed on the fourth surface and including a plurality of second nanostructures having a shape dimension smaller than that of the wavelength of the light emitted from the light source, wherein the plurality of second nanostructures have a shape distribution such that the light emitted from the light source is directed toward the aperture.

The shape distribution of the plurality of first nanostructures may be determined such that the meta-mirror is configured to operate as a concave mirror with respect to the display panel.

The light source may be provided asymmetrically with respect to the aperture.

The light deliverer may include a substrate including a third surface facing the display panel and a fourth surface facing the light source, a first meta-lens disposed on the third surface and including a plurality of first nanostructures having a shape dimension smaller than that of the wavelength of the light emitted from the light source, wherein the plurality of first nanostructures have a shape distribution such that the plurality of first nanostructures are configured to converge the light to a plurality of non-pixel regions, and a second meta-lens disposed on the fourth surface and including a plurality of second nanostructures having a shape dimension smaller than that of the wavelength of the light emitted from the light source, wherein the plurality of second nanostructures have a shape distribution such that the plurality of second nanostructures collimate the light emitted from the light source to correspond to the first meta-lens.

The shape distribution of the plurality of first nanostructures may be determined such that the first meta-lens is configured to operate as a plurality of first convex lenses provided to face the plurality of non-pixel regions, and the shape distribution of the plurality of second nanostructures may be determined such that the second meta-lens is configured to operate as a plurality of second convex lenses provided to face the plurality of first convex lenses, respectively.

The shape distribution of the plurality of first nanostructures may be determined such that the first meta-lens is configured to operate as a plurality of first convex lenses provided to face the plurality of display pixels and the plurality of non-pixel regions, and the shape distribution of the plurality of second nanostructures may be determined such that the second meta-lens is configured to operate as a plurality of second convex lenses provided to face the plurality of first convex lenses, respectively.

The light source may include a plurality of light emitting elements arranged to correspond to the plurality of display pixels and the plurality of non-pixel regions, respectively.

The illumination device may further include a photodetector configured to sense an amount of the light emitted from the light source reflected from the plurality of display pixels, and a light source controller configured to select and drive a number of the plurality of light emitting elements based on the amount of light detected by the photodetector.

The shape distribution of the plurality of first nanostructures and the shape distribution of the plurality of second nanostructures may be determined such that the first meta-lens and the second meta-lens each is configured to operate as a convex lens, respectively.

The illumination device may further include a microlens array disposed between the first meta-lens and the display panel, the microlens array including a plurality of microlenses facing the plurality of non-pixel regions, respectively.

The shape distribution of the plurality of first nanostructures and the shape distribution of the plurality of second nanostructures may be determined such that a focal length of the first meta-lens is shorter than a focal length of the second meta-lens.

The illumination device may further include a reflective structure provided between the light deliverer and the display panel, the reflective structure configured to reflect the light emitted from the light source and directed toward regions of the plurality of display pixels to be directed toward the non-pixel region.

The light deliverer may include a substrate including a third surface facing the display panel and a fourth surface facing the light source, and a plurality of nanostructures disposed on the fourth surface and having a shape dimension smaller than that of a wavelength of light of the light source, the plurality of nanostructures having a shape distribution shaping the light emitted from the light source such that an amount of light directed toward the reflective structure from the light source is similar to an amount of light directed directly toward the transmission window from the light source.

The transmission window may include one region in which the plurality of display pixels are not provided.

A diameter of the transmission window may be 5 mm to 10 mm.

The light deliverer may include a plurality of nanostructures of a shape dimension smaller than that of a wavelength of light emitted from the light source, and the plurality of nanostructures may have a shape distribution such that the light emitted from the light source is focused on the first surface to a beam cross-sectional size corresponding to the transmission window, and then diffused and emitted to a front side of the display panel.

According to another aspect of an example embodiment, there is provided an electronic apparatus including an illumination device including a display panel including a first surface configured to display an image, a second surface opposite to the first surface, a plurality of display pixels disposed between the first surface and the second surface, and a transmission window configured to transmit light incident on the second surface through the first surface, a light source disposed at the second surface of the display panel and configured to emit light to an object toward the display panel, and a light deliverer disposed between the light source and the display panel, the light deliverer configured to deliver the light emitted from the light source to the object as flood illumination through the transmission window, a sensor configured to receive light reflected from the object, and a processor configured to obtain information about the object based on the light received by the sensor.

According to another aspect of an example embodiment, there is provided an illumination device including a display panel including a first surface configured to display an image, a second surface opposite to the first surface, a plurality of display pixels disposed between the first surface and the second surface and configured to reflect light incident from the second surface, and a transmission window configured to transmit the light incident on the second surface through the first surface, a light source disposed at the second surface of the display panel and configured to emit light to an object toward the display panel, a light deliverer disposed between the light source and the display panel and including a third surface and a fourth surface opposite to the third surface, the light deliverer configured to deliver the light emitted from the light source to the object as flood illumination through the transmission window, a meta-mirror disposed on the third surface of the light deliverer and including a plurality of first nanostructures having a sub-wavelength dimension smaller, and a meta-lens disposed on a fourth surface of the light deliverer and including a plurality of second nanostructures having a sub-wavelength dimension.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
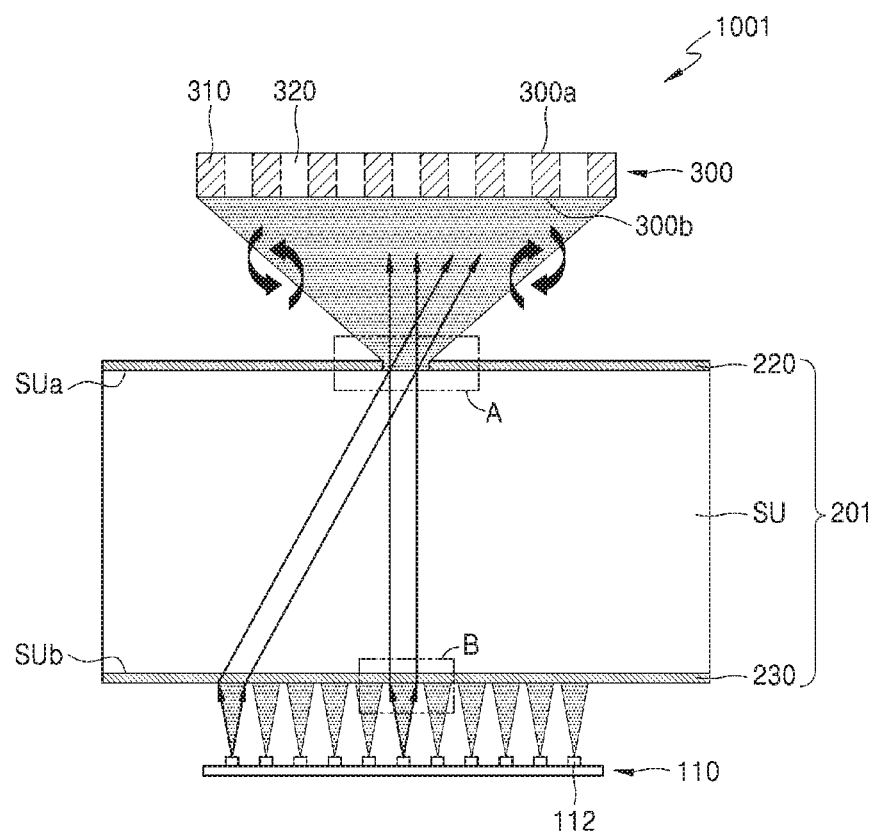
FIG. 1 is a cross-sectional view showing a schematic configuration of an illumination device according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. Sizes of components in the drawings may be exaggerated for convenience and clarity of description. On the other hand, the example embodiments described below are merely exemplary, and various modifications may be made from these example embodiments. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It will be understood that, when a component is referred to as being "on" another component, it may be directly or indirectly on the other component.

As used herein, the singular forms "a," "an," and "the" are intended to include the plural forms as well, unless the context clearly indicates otherwise. It will be further understood that, when a portion "includes" an element, another element may be further included, rather than excluding the existence of the other element, unless otherwise described.

Also, the terms, such as " . . . unit" or "module", used herein refer to a unit that processes at least one function or operation, and the unit may be implemented by hardware or software, or by a combination of hardware and software.

Figure 2A:
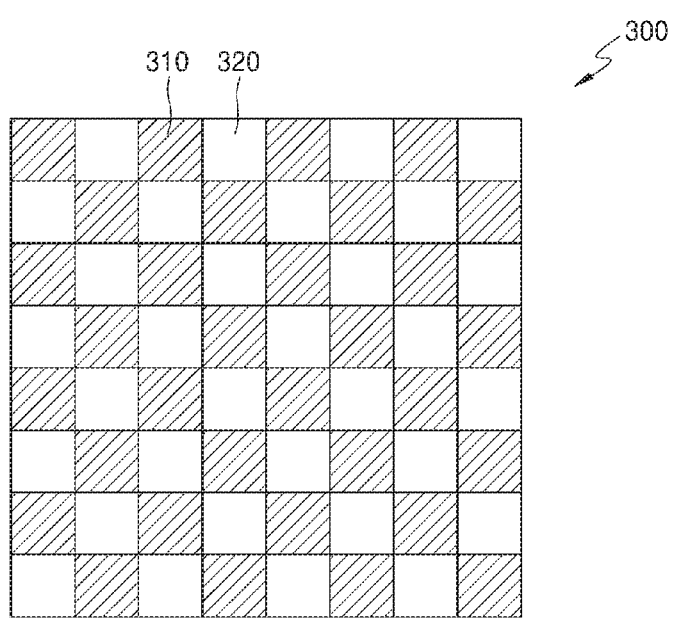
FIG. 2A is a plan view showing an exemplary pixel arrangement of a display panel employed in the illumination device of FIG. 1.
Figure 2B:
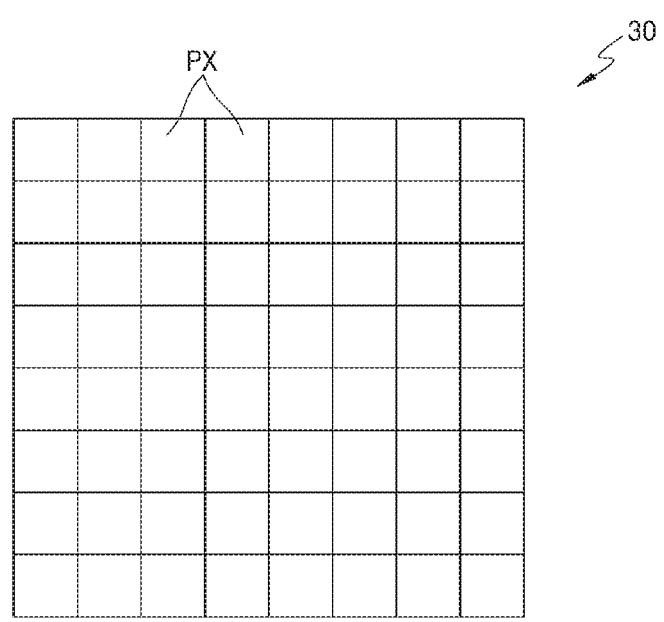
FIG. 2B is a plan view showing a pixel arrangement of a display panel according to a comparative example.
Figure 3A:
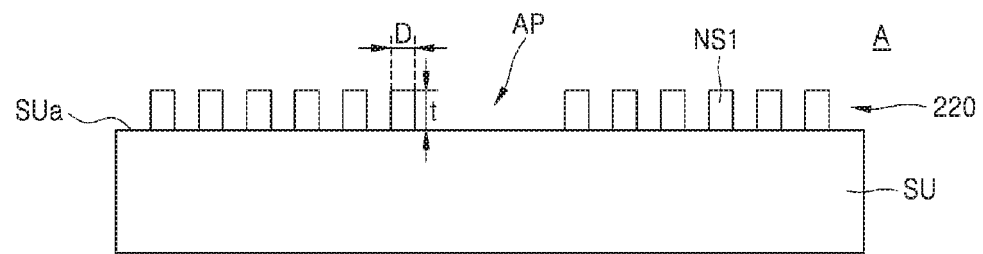
FIG. 3A is a detailed enlarged view showing a part of an upper region of a light deliverer employed in the illumination device of FIG. 1.
Figure 3B:
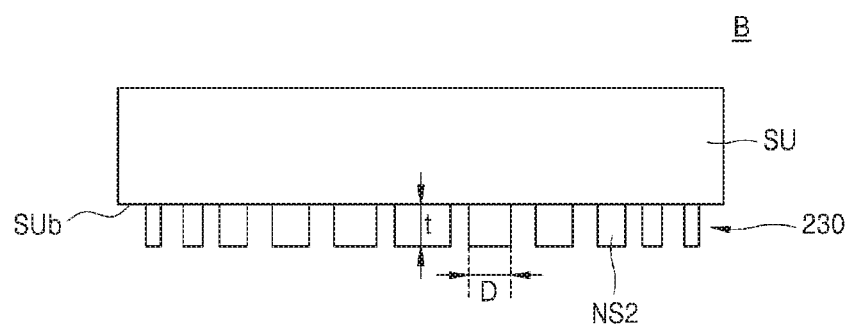
FIG. 3B is a detailed enlarged view showing a part of a lower region of the light deliverer employed in the illumination device of FIG. 1.

FIG. 1 is a cross-sectional view showing a schematic configuration of an illumination device 1001 according to an example embodiment. FIG. 2A is a plan view showing an example pixel arrangement of a display panel 300 employed in the illumination device 1001 of FIG. 1. FIG. 2B is a plan view showing a pixel arrangement of a typical display panel 30 according to a comparative example. FIG. 3A is a detailed enlarged view showing a part of an upper region of a light deliverer 201 employed in the illumination device 1001 of FIG. 1. FIG. 3B is a detailed enlarged view showing a part of a lower region of the light deliverer 201 employed in the illumination device 1001 of FIG. 1.

The illumination device 1001 includes the display panel 300 provided with a transmission window for transmitting light, a light source 110 disposed below the display panel 300 to emit light toward the display panel 300, and the light deliverer 201 disposed between the light source 110 and the display panel 300 to transmit the light emitted from the light source 110 such that the light is emitted to the transmission window of the display panel 300.

The light source 110 may include an array of a plurality of light emitting elements 112. The light emitting element 112 may include an light emitting diode (LED) or a laser diode emitting laser light. The light emitting element 112 may include a vertical cavity surface emitting laser (VCSEL). The light emitting element 112 may include, for example, an active layer formed of an III-V semiconductor material or a II-VI semiconductor material and having a multi-quantum well structure, but is not limited thereto. The light emitting element 112 may emit laser light of wavelength of approximately 850 nm or 940 nm, or may emit near-infrared rays or light of a visible light wavelength band. The wavelength of the light emitted from the light emitting element 112 is not particularly limited, and the light emitting element 112 that emits light in a desired wavelength band may be used.

The display panel 300 includes a first surface 300a on which an image is displayed and a second surface 300b opposite to the first surface 300a. A plurality of display pixels 310 are disposed between the first surface 300a and the second surface 300b. Hereinafter, a surface on which an image is displayed on the display panel 300 may be a display surface. A non-pixel region 320 is disposed between the display pixels 310 and is a transparent window through which light is transmitted. Hereinafter, the non-pixel region 320 may be a transmission window.

The display panel 300 includes a display element, for example, a liquid crystal display (LCD), an organic light emitting diode (OLED). When the display element is the LCD, a light source for the display panel 300 is separately provided. The display element is divided into a plurality of regions that are controlled to be on/off in accordance with image information, and each region may be a display pixel 310. The display pixel 310 includes the display element and circuit elements for controlling the display element, and is an opaque region due to a metal material included therein. That is, light incident on the display pixel 310 from below the display panel 300 is reflected and is not emitted to the front side of the display panel 300. The non-pixel region 320 is a pixel-free region. The non-pixel region 320 is a region in which at least a part of the circuit elements for controlling the display element, for example, a metal pixel electrode, is not provided and may transmit light. Accordingly, the light incident on the non-pixel region 320 may be emitted to the front side of the display panel 300.

As shown in FIG. 2A, the plurality of display pixels 310 and the plurality of non-pixel regions 320 may be alternately arranged. Although the display pixel 310 and the non-pixel region 320 have the same size in FIG. 2A, embodiments are not limited thereto. The size of the non-pixel region 320 may be equal to or less than that of the display pixel 310. For example, a fill factor of a cross-sectional area occupied by the plurality of display pixels 310 on the display surface may be about 50% to about 60%.

Referring to FIG. 2B of the comparative example, in a display panel 30, the display pixels PX are distributed over an entire display surface. Because the display pixel PX includes a metal material that may not transmit light, such as a pixel electrode, etc., the display pixel PX does not transmit light incident from a rear side of the display panel 30.

The illumination device 1001 of an example embodiment uses the display panel 300 in which half of display pixels of a related display panel are replaced with a non-pixel region to illuminate the front side of the display panel 300 with the light of the light source 110 disposed on the rear side of the display panel 300.

The light deliverer 201 is disposed between the light source 110 and the display panel 300 such that the light emitted from the light source 110 passes through the transmission window of the display panel 300 and is delivered to an object as flood illumination. The light deliverer 201 includes a plurality of nanostructures having a shape dimension smaller than the wavelength of the light of the light source 110 and shapes of the plurality of nanostructures or distribution rules of the nanostructures are set such that the operations described above are implemented.

The light deliverer 201 may include a meta-mirror 220 having an aperture AP formed in one side and a meta-lens 230 on the other side. For example, the light deliverer 201 includes a substrate SU provided with a third surface SUa facing the display panel 300, a fourth surface SUb facing the light source 110, the meta-mirror 220 disposed on the third surface SUa and having the aperture AP in the center thereof and the meta-lens 230 disposed on the fourth surface SUb.

Referring to FIG. 3A, the meta-mirror 220 disposed on the third surface SUa includes a plurality of first nanostructures NS1. The plurality of first nanostructures NS1 are distributed on the third surface SUa except on the aperture AP. That is, the aperture AP is a region through which the light of the light source 110 is transmitted because the first nanostructure NS1 is not formed on the third surface SUa. A thickness t or a width D, which is a dimension defining a shape of the first nanostructure NS1, may be less than the wavelength of the light emitted from the light source 110. The first nanostructure NS1 may have a cylindrical shape, an elliptical column, a polygonal column, and various other shapes. The first nanostructure NS1 includes a material having a refractive index higher than that of the substrate SU, and may include a material including any one of, for example, monocrystalline silicon, polycrystalline silicon, amorphous silicon, silicon nitride ($Si_3N_4$), gallium phosphide (GaP), titanium oxide ($TiO_2$), aluminum antimonide (AlSb), aluminum arsenide (AlAs), aluminum gallium arsenide (AlGaAs), aluminum gallium indium phosphide (AlGaInP), boron phosphide (BP), and zinc germanium phosphide ($ZnGeP_2$). The substrate SU supports the plurality of first nanostructures NS1 and may include a material having a refractive index lower than that of the first nanostructure NS1. A refractive index difference between the substrate SU and the first nanostructure NS1 may be about 0.5 or more. The substrate SU may include a polymer, for example, silicon oxide ($SiO_2$), transparent conductive oxide (TCO), polycarbonate (PC), polystyrene (PS), or poly(methyl methacrylate) (PMMA), but is not limited thereto.

The first nanostructure NS1 may have a shape dimension of a sub-wavelength smaller than the wavelength of the light emitted from the light source 110. The first nanostructure NS1 may reflect light of a predetermined wavelength band by a specific shape of the first nanostructure NS1, an arrangement form, and the like. The shape distribution of the plurality of first nanostructures NS1 may be determined such that the meta-mirror 220 operates as a concave mirror with respect to the display panel 300. Here, the shape distribution may be at least one of a shape, size of the first nanostructure NS1, the size, shape distribution of the plurality of first nanostructures NS1, an arrangement pitch of the plurality of first nanostructures NS1, and a distribution of the arrangement pitch of the first nanostructure NS1. At least one of the thickness, the width, and the arrangement pitch of the first nanostructure NS1 may be half or less of the wavelength of the light emitted from the light source 110. In FIG. 3A, the first nanostructure NS1 has a certain size and has a certain interval, but this is an example, and embodiments are not limited thereto.

Referring to FIG. 3B, the meta-lens 230 disposed on the fourth surface SUb includes a plurality of second nanostructures NS2. The plurality of second nanostructures NS2 may include a material having a refractive index higher than that of the substrate SU, have the shape dimension of the sub wavelength and have a shape distribution to operate as a convex lens for collecting the light emitted from the light source 110 toward the aperture AP. The second nanostructure NS2 may have the shape distribution in which the width D decreases from the center to the periphery. These rules may be repeated in a direction from the center to the periphery. A repetition period may not be constant. The shape distribution of the second nanostructure NS2 may be set such that a beam cross-sectional size on the third surface SUa is similar to that of the aperture AP considering a size of the aperture AP, a distance to the aperture AP, etc.

Referring to FIG. 1, a path of the light emitted from the light source 110 will be described.

The light emitted from the light source 110 is directed toward the aperture AP on the upper side of the light deliverer 201 by the meta-lens 230 below the light deliverer 201. The light is directed toward the display panel 300 through the aperture AP and passes through the transmission window of the display panel 300, that is, the plurality of non-pixel regions 320, to illuminate the front side of the display panel 300. The non-pixel region 320 is uniformly distributed on the first surface 300a, which is the display surface of the display panel 300. Therefore, illumination light may be flood illumination light that substantially uniformly illuminates an object in front of the display panel 300.

The light emitted toward the display pixel 310 of the display panel 300 is reflected without passing through the display pixel 310. The reflected light may be reflected by the meta-mirror 220 and directed toward the display panel 300 again. The light that is changed in the path toward the non-pixel region 320 of the display panel 300 may illuminate the front side of the display panel 300. As described above, the light that is reflected without passing through the display pixel 310 is recycled by the meta-mirror 220, and thus, light efficiency may be increased. Also, because the first nanostructures NS1 are arranged such that the meta-mirror 220 serves as a concave mirror, the efficiency of the recycled light contributing to the illumination light may be increased.

Figure 4:
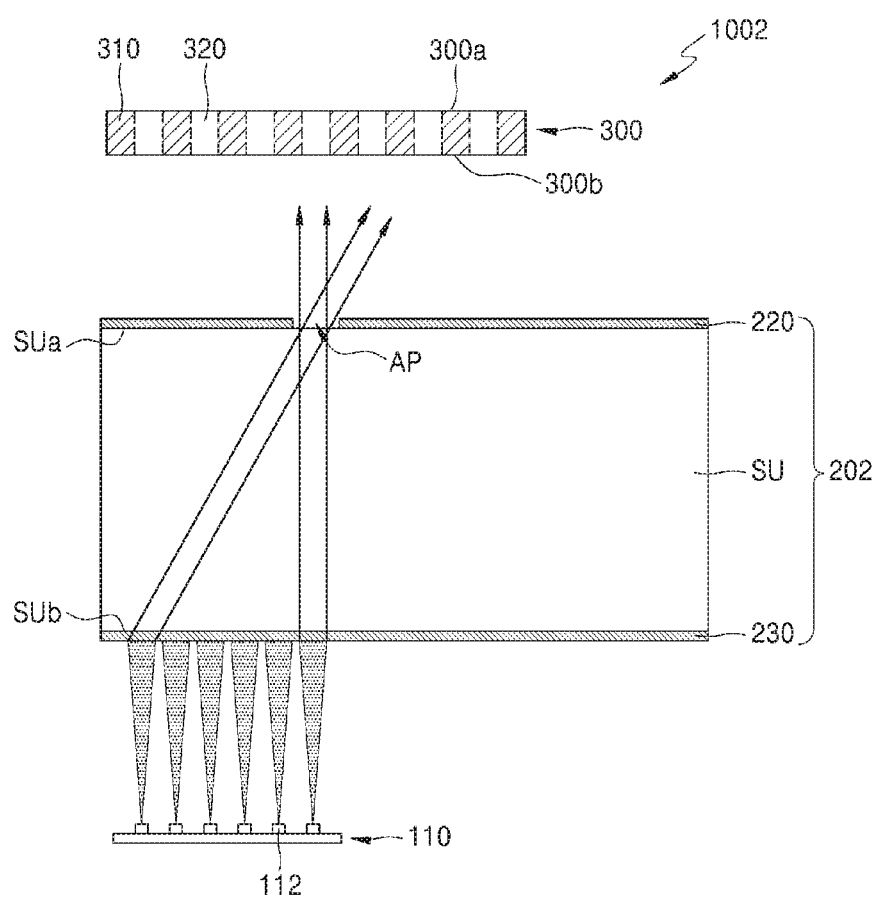
FIG. 4 is a cross-sectional view showing a schematic configuration of an illumination device according to another example embodiment.

FIG. 4 is a cross-sectional view showing a schematic configuration of an illumination device 1002 according to another example embodiment.

The illumination device 1002 includes the display panel 300 having a transmission window for transmitting light, the light source 110 disposed below the display panel 300 to emit light toward the display panel 300, and a light deliverer 202 disposed between the light source 110 and the display panel 300 to transmit the light emitted from the light source 110 to the transmission window of the display panel 300.

The illumination device 1002 of an example embodiment differs from the illumination device 1001 of FIG. 1 in that the light source 110 is arranged asymmetrically with respect to the aperture AP of the light deliverer 202, in order to increase the efficiency of the recycled light, and the remaining configuration thereof is substantially the same.

The light reflected from the display pixel 310 of the display panel 300 may be recycled in case that the light reaches the meta-mirror 220, and the light traveling toward the aperture AP again is not recycled. By arranging the aperture AP and the light source 110 asymmetrically, the amount of light reflected by the display pixel 310 toward the aperture AP is reduced and the efficiency with which the light reflected from the display pixel 310 is recycled may be increased.

Figure 5:
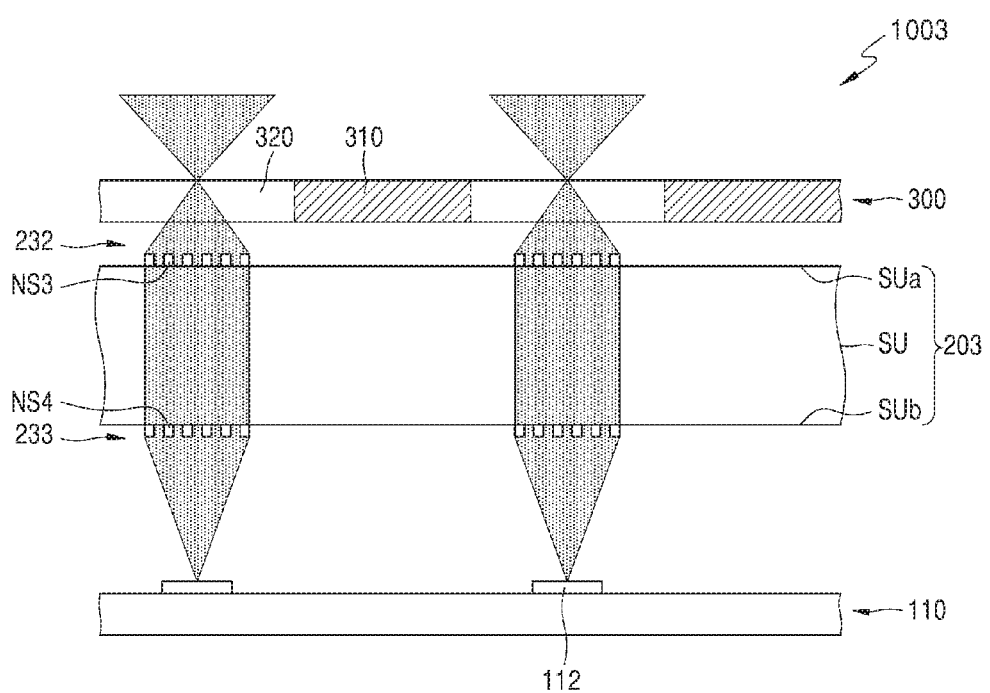
FIG. 5 is a cross-sectional view showing a schematic configuration of an illumination device according to another example embodiment.

FIG. 5 is a cross-sectional view showing a schematic configuration of an illumination device 1003 according to another example embodiment.

The illumination device 1003 includes the display panel 300 having a transmission window for transmitting light, the light source 110 disposed below the display panel 300 to emit light toward the display panel 300, and a light deliverer 203 disposed between the light source 110 and the display panel 300 to transmit the light emitted from the light source 110 to the transmission window of the display panel 300.

In the illumination device 1003 of the example embodiment, the light deliverer 203 includes a first meta-lens 232 on an upper side thereof and a second meta-lens 233 on a lower side thereof so as to collect the light emitted the light source 110 to each of the plurality of non-pixel regions 320.

The first meta-lens 232 disposed on the third surface SUa of the substrate SU includes a plurality of first nanostructures NS3. A shape distribution of the plurality of first nanostructures NS3 is set such that the first nanostructures NS3 operates as a plurality of convex lenses converging light to the plurality of non-pixel regions 320, respectively.

The second meta-lens 233 disposed on the fourth surface SUb of the substrate SU includes a plurality of second nanostructures NS4. The plurality of second nanostructures NS4 may have a shape distribution to collimate the light of the light source 110 to correspond to the first meta-lens 232. A shape distribution of the plurality of second nanostructures NS4 is set such that the second nanostructures NS4 may operate as a plurality of convex lenses. As shown in FIG. 5, the shape distribution of the plurality of second nanostructures NS4 may be set such that the second nanostructures NS4 operate as a plurality of convex lenses respectively corresponding to the plurality of convex lenses of the first meta-lens 232.

The plurality of light emitting elements 112 included in the light source 110 may be arranged at locations corresponding to the plurality of non-pixel regions 320. The light emitted from the light source 110 may be collimated as parallel light in the second meta-lens 233 and directed toward the first meta-lens 232. The light of the first meta-lens 232 may be converged to each of the plurality of non-pixel regions 320 and spread out toward a front side of the display panel 300.

Figure 6:
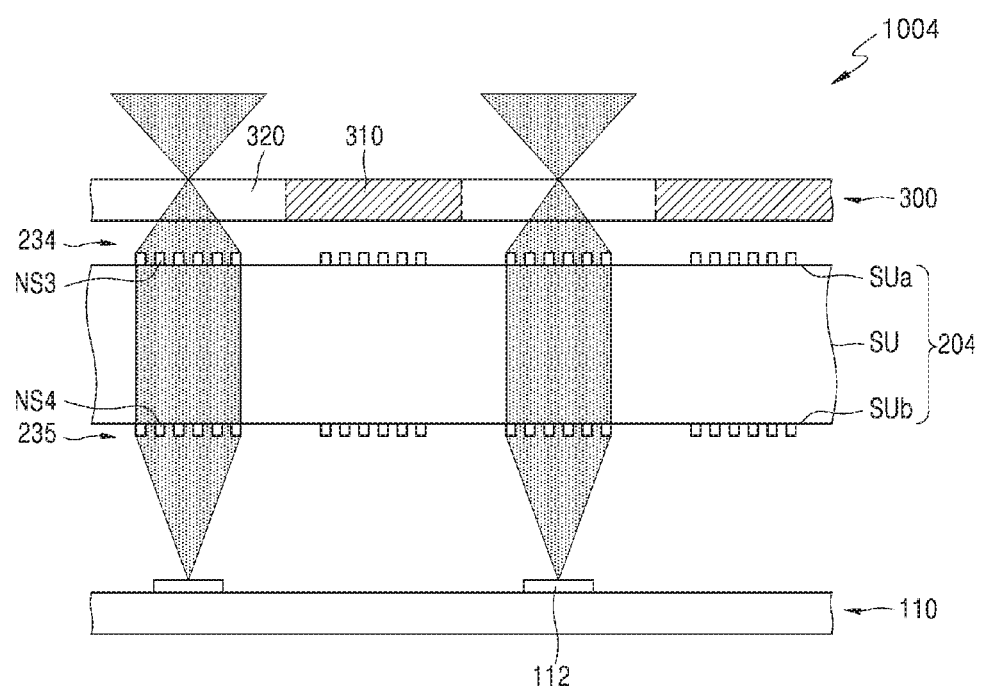
FIG. 6 is a cross-sectional view showing a schematic configuration of an illumination device according to another example embodiment.

FIG. 6 is a cross-sectional view showing a schematic configuration of an illumination device 1004 according to another example embodiment.

The illumination device 1004 includes the display panel 300 having a transmission window for transmitting light, the light source 110 disposed below the display panel 300 to emit light toward the display panel 300, and a light deliverer 204 disposed between the light source 110 and the display panel 300 to transmit the light of the light source 110 to the transmission window of the display panel 300.

The illumination device 1004 of the example embodiment differs from the illumination device 1003 of FIG. 5 in a detailed shape distribution of the first nanostructures NS3 and second nanostructures NS4 respectively provided in a first meta-lens 234 and a second meta-lens 235 constituting the light deliverer 204.

A shape distribution of the first nanostructure NS3 of the first meta-lens 234 is set such that the first nanostructure NS3 operates as a convex lens facing the plurality of display pixels 310 and the plurality of non-pixel regions 320, respectively. Accordingly, the plurality of first nanostructures NS3 are formed not only at locations corresponding to the display pixels 310 but also at locations corresponding to the non-pixel regions 320.

A shape distribution of the second nanostructure NS4 of the second meta-lens 235 is also set such that the second nanostructure NS4 operates as a convex lens facing the plurality of display pixels 310 and the plurality of non-pixel regions 320, respectively. The plurality of second nanostructures NS3 are formed not only at locations corresponding to the display pixels 310 but also at locations corresponding to the non-pixel regions 320.

The above-described configuration of the light deliverer 204 may facilitate the alignment of the light deliverer 204 and the display panel 300 in a manufacturing process. The plurality of first nanostructures NS3 and the second nanostructure NS4 disposed to face the display pixel 310 do not contribute to an optical path for illuminating a front side of the display panel 300 but may reduce alignment errors during manufacture when compared with the structure of the light deliverer 203 of the illumination device 1003 of FIG. 5, by disposing the plurality of first nanostructures NS3 and the second nanostructures NS4 at locations corresponding to both of the display pixel 310 and the non-pixel region 320.

Figure 7:
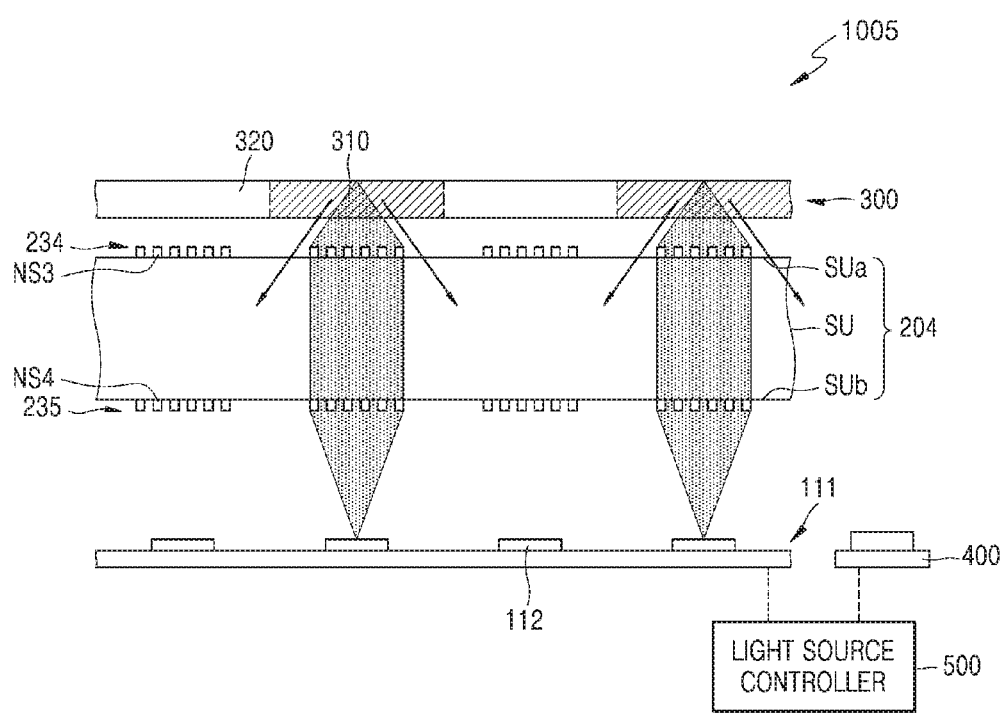
FIG. 7 is a cross-sectional view showing a schematic configuration of an illumination device according to another example embodiment.

FIG. 7 is a cross-sectional view showing a schematic configuration of an illumination device 1005 according to another example embodiment.

The illumination device 1005 of the example embodiment is different from the illumination device 1004 of FIG. 6 in that the plurality of light emitting elements 112 provided in the light source 111 are arranged to correspond to the plurality of display pixels 310 and the plurality of non-pixel regions 320, respectively, and the illumination device 1005 further includes a photodetector 400 and a light source controller 500.

The plurality of light emitting elements 112 provided in the light source 111 may be individually controlled by the light source controller 500 to be on/off. The light emitting elements 112 may be connected in units of columns such that the light emitting elements 112 of even-numbered columns and the light emitting elements 112 of odd-numbered columns may be controlled together to be on/off.

By the above configuration, the light source 111, the light deliverer 204, and the display panel 300 may be more easily aligned in a manufacturing process.

The photodetector 400 is used to sense the amount of light emitted from the light source 111 traveling toward the display pixel 310 and reflected from the display pixel 310 without being emitted to a front side of the display panel 300.

The light source controller 500 may select and drive some of the plurality of light emitting elements 112 based on the amount of light detected by the photodetector 400. For example, an alignment state of the light emitting elements 112 may be determined by comparing the case where only the light emitting elements 112 of the even-numbered columns are driven by the light source 111 and the case where only the light emitting elements 112 of the odd-numbered columns are driven. That is, the light source 111 may be controlled to drive only the light emitting elements 112 at locations corresponding to the non-pixel region 320 by determining whether the light emitting elements 112 at locations corresponding to the non-pixel region 320 are the odd-numbered columns or the even-numbered columns.

Figure 8:
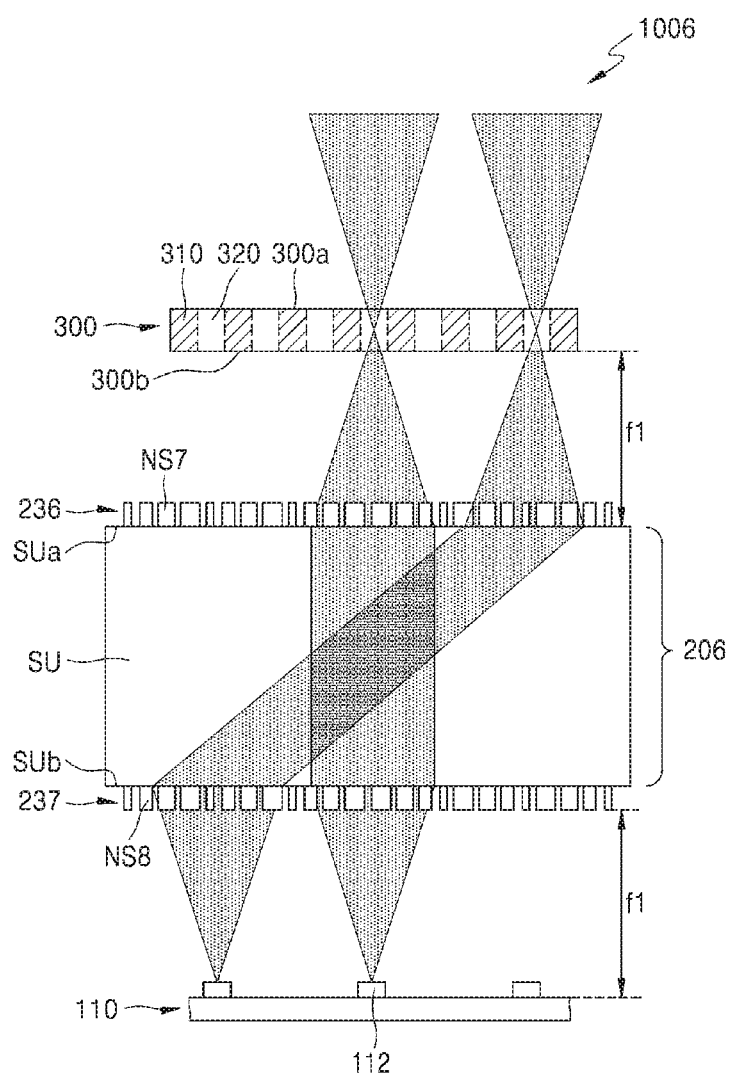
FIG. 8 is a cross-sectional view showing a schematic configuration of an illumination device according to another example embodiment.

FIG. 8 is a cross-sectional view showing a schematic configuration of an illumination device 1006 according to another example embodiment.

The illumination device 1006 includes the display panel 300 having a transmission window for transmitting light, the light source 110 disposed below the display panel 300 to emit light toward the display panel 300, and a light deliverer 206 disposed between the light source 110 and the display panel 300 to transmit the light emitted from the light source 110 to the transmission window of the display panel 300.

The light deliverer 206 includes a first meta-lens 236 disposed on the third surface SUa of the substrate SU and a second meta-lens 237 disposed on the fourth surface SUb. The first meta-lens 236 includes a plurality of first nanostructures NS7 and a shape distribution of the plurality of first nanostructures NS7 is set such that the first nanostructures NS7 operates as one convex lens. The second meta-lens 237 includes a plurality of second nanostructures NS8 and a shape distribution of the plurality of second nanostructures NS8 is set such that the second nanostructures NS8 also operates as one convex lens.

The shape distributions of the plurality of first nanostructures NS7 and the plurality of second nanostructures NS8 may be determined such that the first meta-lens 236 and the second meta-lens 237 have the same focal distance f1 as shown in FIG. 8.

Figure 9:
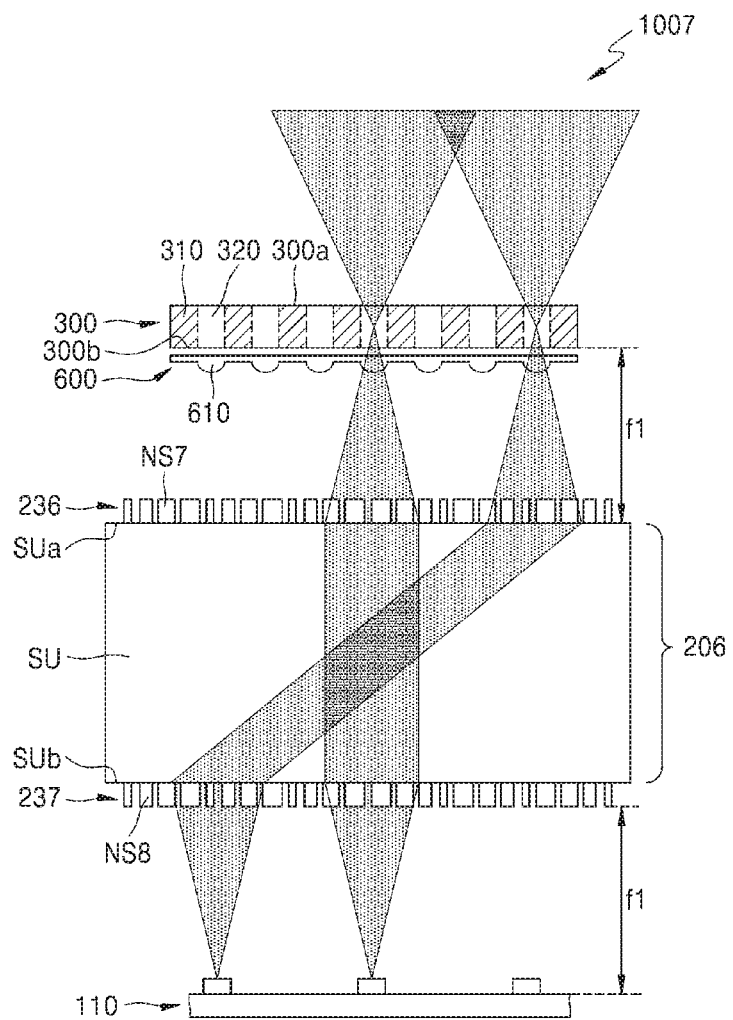
FIG. 9 is a cross-sectional view showing a schematic configuration of an illumination device according to another example embodiment.

FIG. 9 is a cross-sectional view showing a schematic configuration of an illumination device 1007 according to another example embodiment.

The illumination device 1007 includes the display panel 300 having a transmission window for transmitting light, the light source 110 disposed below the display panel 300 to emit light toward the display panel 300, and the light deliverer 206 disposed between the light source 110 and the display panel 300 to transmit the light emitted from the light source 110 to the transmission window of the display panel 300.

The illumination device 1007 of the example embodiment differs from the illumination device 1006 of FIG. 8 in that a microlens array 600 is further disposed between the light deliverer 206 and the display panel 300 and the remaining configuration thereof is substantially the same. The microlens array 600 includes a plurality of microlenses 610 respectively facing the plurality of non-pixel regions 320 of the display panel 300. Light focused on the non-pixel region 320 by the first meta-lens 236 and the microlenses 610 spreads toward a front side of the display panel 300 at a wider angle of view than when focused by the first meta-lens 236.

The presence or absence of the microlens array 600 and a refracting power of the microlens 610 may be determined considering a detailed distribution of flood illumination to be illuminated toward the front side of the display panel 300. Flood illumination is illumination of a generally uniform light distribution, and may be needed to adjust uniformity according to a distance from an object and a shape of the object.

Figure 10:
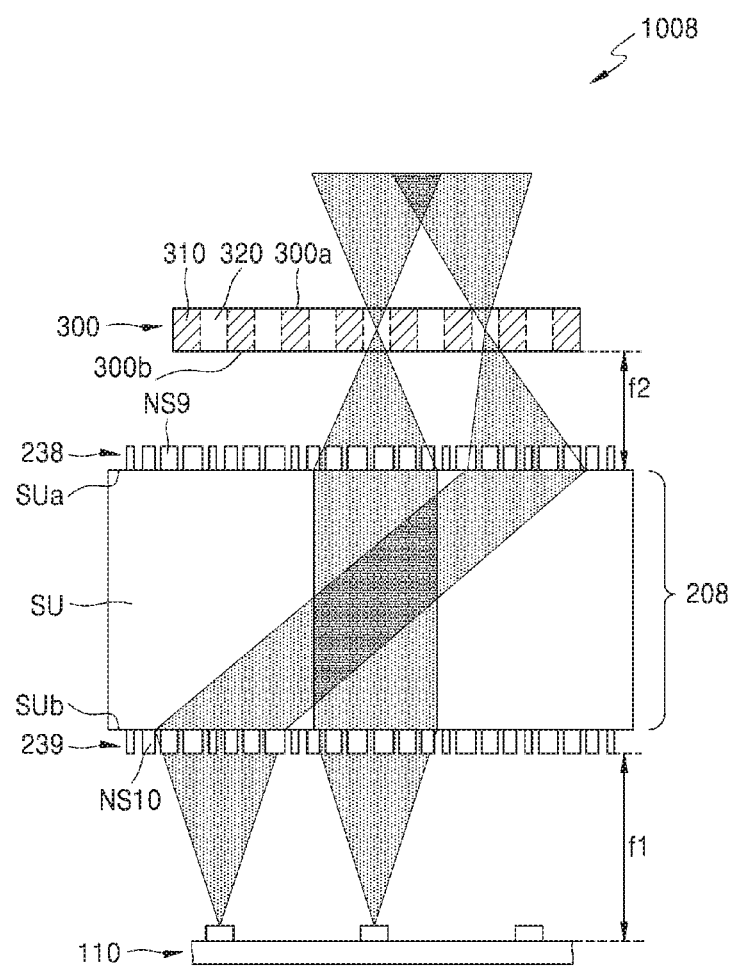
FIG. 10 is a cross-sectional view showing a schematic configuration of an illumination device according to another example embodiment.

FIG. 10 is a cross-sectional view showing a schematic configuration of an illumination device 1008 according to another example embodiment.

The illumination device 1008 includes the display panel 300 having a transmission window for transmitting light, the light source 110 disposed below the display panel 300 to emit light toward the display panel 300, and a light deliverer 208 disposed between the light source 110 and the display panel 300 to transmit the light emitted from the light source 110 to the transmission window of the display panel 300.

The illumination device 1008 of the example embodiment differs from the illumination device 1006 of FIG. 8 in a detailed shape distribution of the first nanostructures NS9 and second nanostructures NS10 respectively provided in a first meta-lens 238 and a second meta-lens 239 constituting the light deliverer 208.

Shape distributions of the plurality of first nanostructures NS9 and the plurality of second nanostructures NS10 may be determined such that the first meta-lens 238 has a shorter focal distance than the second meta-lens 239. The plurality of second nanostructures NS10 may have the shape distribution implementing the focal length f1, and the plurality of first nanostructures NS9 may have the shape distribution implementing a focal length f2 shorter than the focal length f1.

A degree by which the refractive power of the first meta-lens 238 is different from the refractive power of the second meta-lens 239 may be determined considering a detailed distribution shape of flood illumination to be illuminated toward a front side of the display panel 300 in the similar manner as in the illumination device 1007 of FIG. 9.

Figure 11:
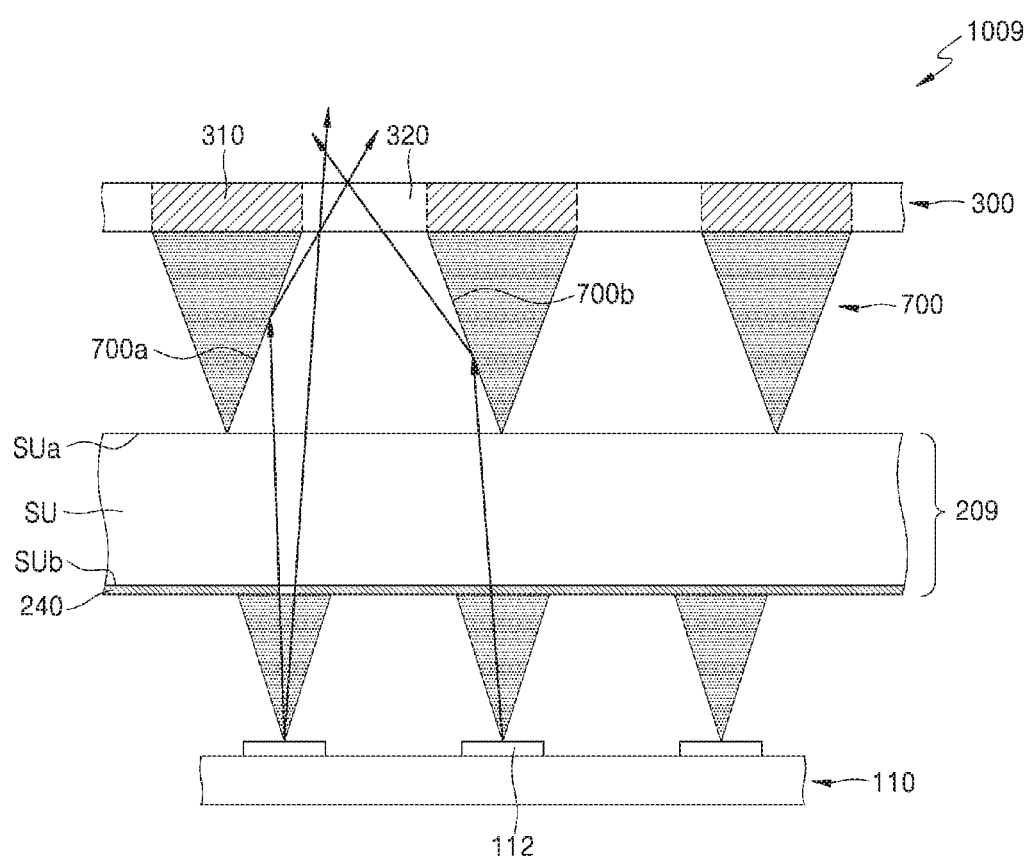
FIG. 11 is a cross-sectional view showing a schematic configuration of an illumination device according to another example embodiment.

FIG. 11 is a cross-sectional view showing a schematic configuration of an illumination device 1009 according to another example embodiment.

The illumination device 1009 includes the display panel 300 having a transmission window for transmitting light, the light source 110 disposed below the display panel 300 to emit light toward the display panel 300, and a light deliverer 209 disposed between the light source 110 and the display panel 300 to transmit the light emitted from the light source 110 to the transmission window of the display panel 300. A reflective structure 700 is disposed between the light deliverer 209 and the display panel 300 to change a path of the light toward the plurality of display pixels 310 to be directed to the non-pixel region 320.

The light deliverer 209 includes a meta shaper 240 disposed on the fourth surface SUb of the substrate SU. The meta-shaper 240 collimates and shapes the light emitted from the light source 110, considering a shape of the reflective structure 700, such that light directed toward the non-pixel region 320 of the display panel 300 via the reflective structure 700 and light directly directed toward the non-pixel region 320 of the display panel 300 from the light source 110 are generally emitted in a front side of the display panel 300 at a uniform distribution. The meta-shaper 240 includes a plurality of nanostructures of a sub-wavelength dimension. The plurality of nanostructures may have a shape distribution such that the amount of light directed toward the reflective structure 700 is generally similar to the amount of light directed directly to the non-pixel region 320 from the light source 110.

The reflective structure 700 includes a plurality of inclined surfaces 700a and 700b that are inclined with respect to the third surface SUa of the substrate SU. The inclined surfaces 700a and 700b may be mirror coated surfaces that reflect light. The reflective structure 700 may include a reflective metal material. A shape of the reflective structure 700, for example, an inclination angle of the inclined surfaces 700a and 700b or a size of the reflective structure 700, may be determined considering a distribution of flood illumination to be formed on the front side of the display panel 300. This also relates to the shape distribution of the nanostructures constituting the meta-shaper 240. For example, based on the shape, size, and the like of the reflective structure 700, the shape distribution of the nanostructures constituting the meta-shaper 240 may be determined such that a light distribution of emitted light toward the reflective structure 700 meets a predetermined requirement.

Figure 12:
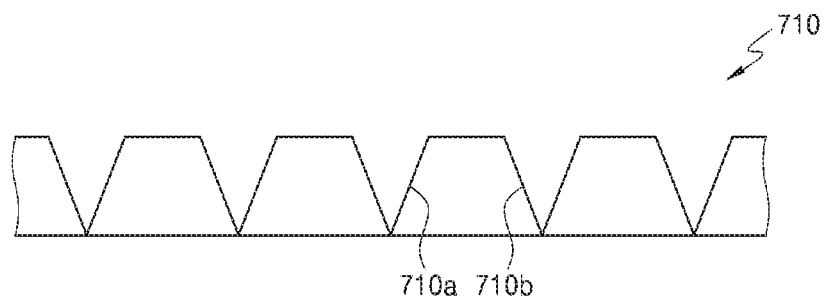
FIG. 12 is a cross-sectional view showing a modified example of a reflective structure that may be employed in the illumination device of FIG. 11.

FIG. 12 is a cross-sectional view showing a modified example of a reflective structure 710 that may be employed in the illumination device 1009 of FIG. 11.

The reflective structure 710 may be a high refractive index structure having total reflection surfaces 710a and 710b that cause total reflection according to a difference in a refractive index as shown in FIG. 12, but embodiments are not limited thereto. The reflective structure 710 may have various shapes including a total reflection surface.

Figure 13:
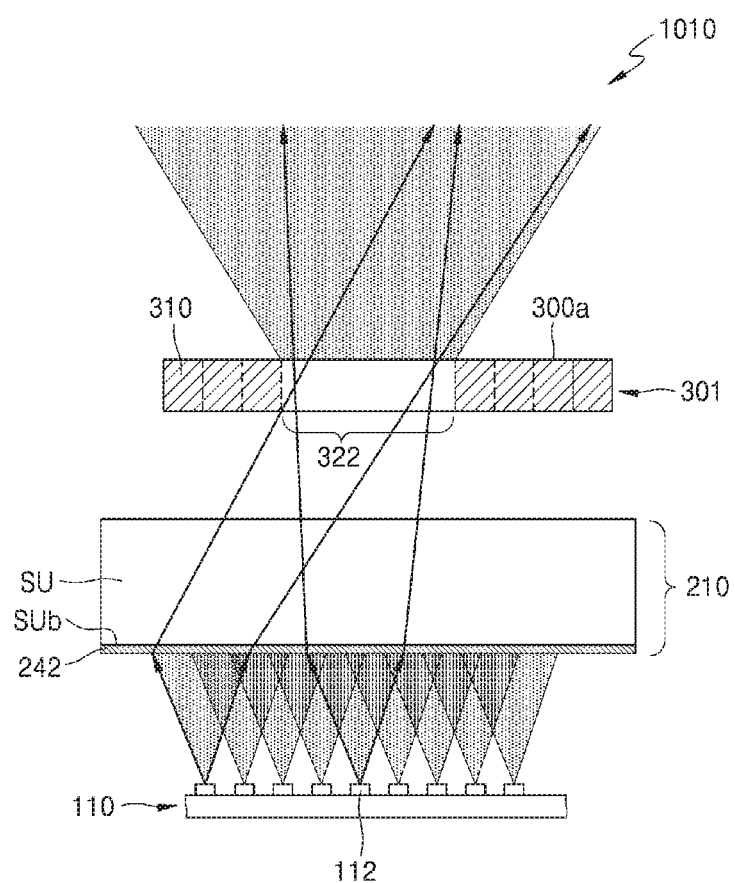
FIG. 13 is a cross-sectional view showing a schematic configuration of an illumination device according to another example embodiment.

FIG. 13 is a cross-sectional view showing a schematic configuration of an illumination device 1010 according to another example embodiment.

The illumination device 1010 includes a display panel 301 having a transmission window for transmitting light, the light source 110 disposed below the display panel 301 to emit light toward the display panel 301, and a light deliverer 210 disposed between the light source 110 and the display panel 301 to transmit the light emitted from the light source 110 to the transmission window of the display panel 301.

The illumination device 1010 of the example embodiment is different from the illumination devices of the above-described example embodiments in that the transmission window of the display panel 301 includes one non-pixel region 322 in which the display pixel 310 is not located.

A location of the non-pixel region 322 may be formed at any location on a display surface of the display panel 301. Such a display panel 301 may be formed in such a manner of removing pixels of a certain region in a display pixel arrangement of, for example, the typical display panel 30 as shown in FIG. 2B. The non-pixel region 322 may have a diameter of about 5 mm to about 10 mm.

The light deliverer 210 includes a meta-shaper 242 disposed on the fourth surface SUb of the substrate SU. The meta-shaper 242 collimates and shapes the light emitted from the light source 110, considering a size, a location, a shape, etc. of the non-pixel region 322, such that the light emitted from the light source 110 forms a beam cross-section similar to the size of the non-pixel region 322 at the location of the non-pixel region 322, and then is diffused and emitted toward a front side of the display panel 300. The meta-shaper 242 includes a plurality of nanostructures of a sub-wavelength. The plurality of nanostructures may have a shape distribution such that the nanostructures collect, for example, the light of the light source 110 on a first side 310a that is the display surface of the display panel 301 to the beam cross-section size corresponding to the non-pixel region 322, and then diffuse and emit the light.

The illumination device 1010 of the example embodiment employs the meta-shaper 242 that sets the shape distribution of the nanostructure so as to be able to perform beam forming with a desired light distribution to use the non-pixel region 322 of a relatively small size compared to the above-described illumination devices 1001 to 1009, thereby reducing the sacrifice of the display pixel 310.

The illumination devices 1001 to 1010 of the above-described example embodiments may be employed in various electronic apparatuses that use the concept of illuminating an object through a display panel.

Figure 14:
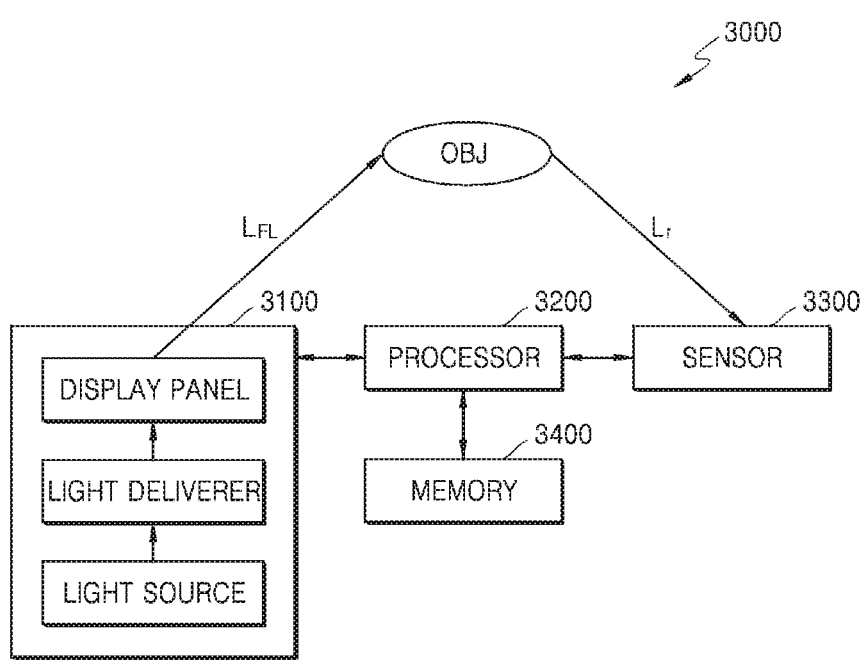
FIG. 14 is a block diagram showing a schematic configuration of an electronic apparatus according to an example embodiment.

FIG. 14 is a block diagram showing a schematic configuration of an electronic apparatus 3000 according to an example embodiment.

The electronic apparatus 3000 includes an illumination device 3100 providing flood illumination toward an object OBJ, a sensor 3300 receiving light reflected from the object OBJ, and a processor 3200 performing an operation for obtaining information about the object OBJ from the light received from the sensor 3300.

The electronic apparatus 3000 may also include a memory 3400 in which code or data for execution of the processor 3200 is stored.

The illumination device 3100 includes a light source, a light deliverer, and a display panel, and illuminates the object OBJ through a transmission window of the display panel by changing a distribution of the light of the light source, and may employ one of the illumination devices 1001 to 1010 of the above-described example embodiments, a combination thereof, and a modified form may be employed.

Between the illumination device 3100 and the object OBJ, optical elements for adjusting a direction such that light $L_{FL}$ of the illumination device 3100 is directed to the object OBJ or an additional modulation may be further disposed.

The illumination device 3100 may illuminate the object OBJ with flood light $L_{FL}$. The flood light $L_{FL}$ illuminates the entire object OBJ at a time with a uniform light distribution. Here, the uniform light distribution does not may not be a uniformity of 100% but an illumination target region of the object OBJ may be generally uniformly illuminated. Therefore, a detailed configuration of the light deliverer of the illumination device 3100, that is, a shape distribution of nanostructures provided in the light deliverer, may be determined such that a desired uniformity distribution of the flood light $L_{FL}$ is implemented according to a location and a shape of the object OBJ. The object OBJ may be the face of a user of the electronic apparatus 3000. The location of the object OBJ may be about 30 cm to about 1 m from the illumination device 3100, but embodiments are not limited thereto.

The sensor 3300 senses light $L_r$ reflected by the object OBJ. The sensor 3300 may include an array of light detection elements. The sensor 3300 may further include a spectroscopic element for analyzing the light $L_r$ reflected from the object OBJ for each wavelength.

The processor 3200 performs the operation for obtaining the information about the object OBJ from the light received by the sensor 3300, and may also manage the entire processing and control of the electronic apparatus 3000. The processor 3200 may obtain the information about the object OBJ, for example, obtain and process two-dimensional or three-dimensional image information, and may also generally control driving of a light source provided in the illumination device 3100 or an operation of the sensor 3300, etc. The processor 3200 may also determine whether the user is authenticated or the like based on the information obtained from the object OBJ and may execute other applications.

The memory 3400 may store code for execution in the processor 3200, various execution modules executed by the electronic apparatus 3000, and data for the various execution modules. For example, the memory 3400 may store program code used in the arithmetic operation for the processor 3200 to obtain the information of the object OBJ, and code such as an application module that may be executed using the information of the object OBJ. Also, the memory 3400 may store a communication module, a camera module, a moving image reproduction module, an audio reproduction module, and the like as a device that may be additionally provided in the electronic apparatus 3000 and a program for driving the device.

A result of the arithmetic operation in the processor 3200, that is, information about a shape and a location of the object OBJ, may be transmitted to another electronic apparatus or unit as needed. For example, the information about the object OBJ may be transmitted to a controller of the other electronic apparatus using the information about the object OBJ. The other unit to which the result is transmitted may be a display device or a printer that outputs the result. In addition, the other unit may include a smartphone, a cellular phone, a personal digital assistant (PDA), a laptop, a PC, various wearable devices, and another mobile or non-mobile computing device, but embodiments are not limited thereto.

The memory 3400 may include at least one storage medium of a flash memory type, a hard disk type, a multimedia card micro type, a card type memory (e.g., SD or XD memory), random access memory (RAM), static random access memory (SRAM), read only memory (ROM), electrically erasable programmable read-only memory (EEPROM), programmable read-only memory (PROM), an optical disc, a magnetic disc, and an optical disc, and the like.

The electronic apparatus 3000 may be, for example, a portable mobile communication device, a smart phone, a smart watch, a personal digital assistant (PDA), a laptop, a PC, another mobile or non-mobile computing device, but embodiments are not limited thereto. The electronic apparatus 3000 may be an autonomous driving device such as an unmanned vehicle, an autonomous drive vehicle, a robot, a drone, or the like, or an Internet of things (IoT) device.

Figure 15:
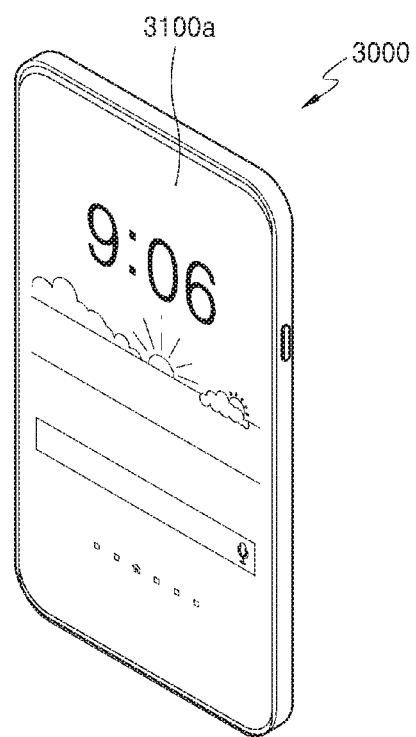
FIG. 15 is a perspective view showing an example of an external appearance of the electronic apparatus of FIG. 14.

FIG. 15 is a perspective view showing an example of an external appearance of the electronic apparatus 3000 of FIG. 14.

The electronic apparatus 3000 may have a display of full screen type as shown in FIG. 15. That is, the electronic apparatus 3000 may be bezel-less type that almost an entire area of a front side of the electronic apparatus 3000 is display surface. Further, a shape of the display surface 3100a may be a notch-free rectangular shape.

As described above, the illumination device according to the example embodiments may be disposed at a back side of a display panel and illuminate a front side of the display panel through transmission windows which are uniformly distributed on an entire display surface or formed in one region of a predetermined size on a display surface. Thus, a bezel-less and notch-free display of the illustrated external appearance may be applied to the electronic apparatus 3000.

Specific implementations described in the example embodiment are examples and do not in any way limit the scope of the disclosure. Also, connections or connecting members of lines between components shown in the figures illustrate examples of functional connections and/or physical or circuit connections, which may be a variety of functional connections, physical connections, or circuit connections that may be replaced or additionally provided s in actual devices.

The above-described illumination device may emit light from a light source arranged on a back side of a display panel to a front side of the display panel.

Therefore, the light source necessary for various sensors may be more effectively arranged without affecting the area of display surface of the display panel.

For example, the above-described illumination device may be employed in a bezel-less type mobile device or the like.

It should be understood that example embodiments described herein should be considered in a descriptive sense only and not for purposes of limitation. Descriptions of features or aspects within each example embodiment should typically be considered as available for other similar features or aspects in other embodiments.

While example embodiments have been described with reference to the figures, it will be understood by those of ordinary skill in the art that various changes in form and details may be made therein without departing from the spirit and scope as defined by the following claims.

What is claimed is:

1. An illumination device comprising:
   a display panel comprising a first surface configured to display an image, a second surface opposite to the first surface, a plurality of display pixels disposed between the first surface and the second surface, and a transmission window configured to transmit light incident on the second surface through the first surface;
   a light source disposed at the second surface of the display panel and configured to emit light to an object toward the display panel; and
   a light deliverer disposed between the light source and the display panel, the light deliverer configured to deliver the light emitted from the light source to the object as flood illumination through the transmission window,
   wherein the light deliverer comprises a plurality of nanostructures having a shape dimension smaller than that of a wavelength of the light emitted from the light source.

2. The illumination device of claim 1,
   wherein the transmission window comprises a plurality of non-pixel regions,
   wherein the plurality of display pixels are configured to reflect the light emitted from the light source, and
   wherein the plurality of display pixels and the plurality of non-pixel regions are alternately provided.

3. The illumination device of claim 2, wherein a fill factor of a cross-sectional area occupied by the plurality of display pixels on the first surface is 50% to 60%.

4. The illumination device of claim 2, wherein the light deliverer comprises:
   a substrate comprising a third surface facing the display panel and a fourth surface facing the light source;
   a meta-mirror disposed on the third surface and comprising a plurality of first nanostructures having a shape dimension smaller than that of the wavelength of the light emitted from the light source, wherein the plurality of first nanostructures have a shape distribution such that the plurality of first nanostructures is configured to operate as a mirror in which an aperture is formed in a center portion, and
   a meta-lens disposed on the fourth surface and comprising a plurality of second nanostructures having a shape dimension smaller than that of the wavelength of the light emitted from the light source, wherein the plurality of second nanostructures have a shape distribution such that the light emitted from the light source is directed toward the aperture.

5. The illumination device of claim 4, wherein the shape distribution of the plurality of first nanostructures is determined such that the meta-mirror is configured to operate as a concave mirror with respect to the display panel.

6. The illumination device of claim 4, wherein the light source is provided asymmetrically with respect to the aperture.

7. The illumination device of claim 2, wherein the light deliverer comprises:
   a substrate comprising a third surface facing the display panel and a fourth surface facing the light source;
   a first meta-lens disposed on the third surface and comprising a plurality of first nanostructures having a shape dimension smaller than that of the wavelength of the light emitted from the light source, wherein the plurality of first nanostructures have a shape distribution such that the plurality of first nanostructures are configured to converge the light to the plurality of non-pixel regions, and a second meta-lens disposed on the fourth surface and comprising a plurality of second nanostructures having a shape dimension smaller than that of the wavelength of the light emitted from the light source, wherein the plurality of second nanostructures have a shape distribution such that the plurality of second nanostructures collimate the light emitted from the light source to correspond to the first meta-lens.

8. The illumination device of claim 7, wherein the shape distribution of the plurality of first nanostructures is determined such that the first meta-lens is configured to operate as a plurality of first convex lenses provided to face the plurality of non-pixel regions, and wherein the shape distribution of the plurality of second nanostructures is determined such that the second meta-lens is configured to operate as a plurality of second convex lenses provided to face the plurality of first convex lenses, respectively.

9. The illumination device of claim 7, wherein the shape distribution of the plurality of first nanostructures is determined such that the first meta-lens is configured to operate as a plurality of first convex lenses provided to face the plurality of display pixels and the plurality of non-pixel regions, and wherein the shape distribution of the plurality of second nanostructures is determined such that the second meta-lens is configured to operate as a plurality of second convex lenses provided to face the plurality of first convex lenses, respectively.

10. The illumination device of claim 9, wherein the light source comprises a plurality of light emitting elements arranged to correspond to the plurality of display pixels and the plurality of non-pixel regions, respectively.

11. The illumination device of claim 10, further comprising:

a photodetector configured to sense an amount of the light emitted from the light source reflected from the plurality of display pixels; and a light source controller configured to select and drive a number of the plurality of light emitting elements based on the amount of light detected by the photodetector.

12. The illumination device of claim 7, wherein the shape distribution of the plurality of first nanostructures and the shape distribution of the plurality of second nanostructures are determined such that the first meta-lens and the second meta-lens each is configured to operate as a convex lens, respectively.

13. The illumination device of claim 12, further comprising a microlens array disposed between the first meta-lens and the display panel, the microlens array comprising a plurality of microlenses facing the plurality of non-pixel regions, respectively.

14. The illumination device of claim 12, wherein the shape distribution of the plurality of first nanostructures and the shape distribution of the plurality of second nanostructures are determined such that a focal length of the first meta-lens is shorter than a focal length of the second meta-lens.

15. The illumination device of claim 2, further comprising a reflective structure provided between the light deliverer and the display panel, the reflective structure configured to reflect the light emitted from the light source and directed toward regions of the plurality of display pixels to be directed toward a non-pixel region.

16. Illumination device of claim 15, wherein the light deliverer comprises:

a substrate comprising a third surface facing the display panel and a fourth surface facing the light source, and wherein the plurality of nanostructures having a shape distribution shaping the light emitted from the light source such that an amount of light directed toward the reflective structure from the light source is similar to an amount of light directed directly toward the transmission window from the light source.

17. The illumination device of claim 1, wherein the transmission window comprises one region in which the plurality of display pixels are not provided.

18. The illumination device of claim 17, wherein a diameter of the transmission window is 5 mm to 10 mm.

19. The illumination device of claim 17, wherein the plurality of nanostructures have a shape distribution such that the light emitted from the light source is focused on the first surface to a beam cross-sectional size corresponding to the transmission window, and then diffused and emitted to a front side of the display panel.

20. An electronic apparatus comprising:

an illumination device comprising:

a display panel comprising a first surface configured to display an image, a second surface opposite to the first surface, a plurality of display pixels disposed between the first surface and the second surface, and a transmission window configured to transmit light incident on the second surface through the first surface;

a light source disposed at the second surface of the display panel and configured to emit light to an object toward the display panel; and a light deliverer disposed between the light source and the display panel, the light deliverer configured to deliver the light emitted from the light source to the object as flood illumination through the transmission window, wherein the light deliverer comprises a plurality of nanostructures having a shape dimension smaller than that of a wavelength of the light emitted from the light source;

a sensor configured to receive light reflected from the object; and a processor configured to obtain information about the object based on the light received by the sensor.

* * * * *